US005777326A

United States Patent [19]

Rockwood et al.

[11] Patent Number: 5,777,326

[45] Date of Patent: Jul. 7, 1998

[54] MULTI-ANODE TIME TO DIGITAL CONVERTER

[75] Inventors: Alan Rockwood, Provo; Larry J. Davis, Highland, both of Utah

[73] Assignee: Sensor Corporation, Provo, Utah

[21] Appl. No.: 751,509

[22] Filed: Nov. 15, 1996

[51] Int. Cl.$^{6}$ .......... H01J 37/252

[52] U.S. Cl. .......... 250/287

[58] Field of Search .......... 250/287, 286, 250/283, 397, 309, 305

[56] References Cited

U.S. PATENT DOCUMENTS

| | | | |
|---|---|---|---|
| 3,639,741 | 2/1972 | Carrick | 235/154 |
| 3,715,590 | 2/1973 | Auer | 250/287 |
| 4,694,168 | 9/1987 | Le Beyec et al. | 250/287 |
| 5,077,472 | 12/1991 | Davis | 250/287 |
| 5,166,521 | 11/1992 | Hayashi et al. | 250/287 |
| 5,367,162 | 11/1994 | Holland et al. | 250/287 |
| 5,428,357 | 6/1995 | Haab et al. | 341/155 |
| 5,633,495 | 5/1997 | Niehuis | 250/287 |

*Primary Examiner*—Kiet T. Nguyen

*Attorney, Agent, or Firm*—Thorpe, North & Western, L.L.P.

[57] ABSTRACT

A method and apparatus for extending the dynamic range of a data acquisition device. A system of multiple anode detectors are used to increase the dynamic range of a time-to-digital converter. Multiple anodes enable the system to determine characteristics of a signal without distortion of the signal which normally occurs with large signals, or obscuring of the signal by noise which normally occurs with small signals. The data from the multi-anode system can be processed so that the total number of impacts of the signal on the multiple anodes are summed during selectable time frames and made available as multiple bit words. This approach combines virtually all the advantages of a transient digitizer with the advantages of a time to digital converter when acquiring signals from pulse-based detectors such as microchannel plates.

40 Claims, 15 Drawing Sheets

Transient Digitizer

Time to Digital Converter (TDC)

MULTI-ANODE TIME TO DIGITAL CONVERTER

BACKGROUND OF THE INVENTION

1. Field of the Invention

This invention pertains to a system and method for acquisition of transient data from microchannel plates or pulse-based detectors. More specifically, the present invention provides a system and method for detecting, recording and displaying time of flight mass spectrometry data with better time resolution, low noise, a higher dynamic range, and improved signal averaging properties.

2. State of the Art

For the purposes of this invention, time of flight (TOF) mass spectrometry will be defined as the conversion of an electrically recorded mass spectra into a chemically recognizable form. Preferably, the resulting data includes the analysis of two parameters of the mass spectra signal. The first parameter is the position of the spectral peaks with respect to time, and secondly, the magnitude or intensity of the peaks. The first parameter is representative of the mass of the ions giving rise to the respective peaks, and the second parameter, which has been established to be reliably indicated by the peak height or peak area at maximum for high resolution scans, is representative of the proportion of ion current carried by the particular species in a sample.

It is important to note that while the background of mass spectrometers is specifically addressed hereafter, this same information can be applied to optical systems which detect photons instead of ions. The present invention is also able to improve upon photon detectors as will be explained. Ions and photons can both be referred to as particles, and the present invention is concerned with detection of a stream of particles.

FIG. 1A is a graph which illustrates output representative of information captured and displayed by an electronic data acquisition device known to those skilled in the art as a transient digitizer. The displayed waveform 10 immediately presents two advantages of the transient digitizer. First, the waveform 10 is shown to have a scaled output which easily displays the different intensities 12, 14, 16 of the peak values being detected as shown by the y-axis "relative intensity" and x-axis "time". Second, the entire waveform 10 is displayed as a complete waveform when retrieved from a memory. One of the properties of a transient digitizer is good dynamic range. As understood by those skilled in the art, the dynamic range refers to the ability of the data acquisition device to detect the impact of objects or particles on a detector. More specifically, it is the ability to acquire (detect) both large and small signals without distortion of the signal which normally occurs with large signals, or an obscuring of the signal by noise when the signal is small.

The structure of the transient digitizer which is capable of generating the graph of FIG. 1A is shown in FIG. 3A. The transient digitizer is actually indicated at 24 as the electronics associated with the single anode detector 22. The digitizer 24 is thus electrically coupled to a time of flight mass spectrometer, also known as a waveform recorder, which is generally indicated at 20. A time of flight mass spectrometer 20 is typically constructed of a chamber having an outer vacuum housing 30 and an inner flight tube 32 shown in cross-section. FIG. 3A shows the inner flight tube 32 along its length. The cross section of the inner flight tube 32, however, can be circular, square or other appropriate tube shape as known to those skilled in the art of time of flight mass spectrometry. An input port 34 enables particles (ions) to be injected into the flight tube 32 and accelerated down the length of the flight tube 32 by a combination of a pulser 36 (a.k.a. a pulsed repeller plate) and a series of field defining electrodes 38 which are disposed so as to define a pathway 31 within the vacuum housing 30 for the ions to travel. A particle is accelerated down the flight tube 32 toward a microchannel plate 26 and the single anode detector 22. Particles striking the microchannel plate 26 are then detected as an electrical pulse on the single anode detector 22, which in turn causes the single anode detector 22 to generate an electrical signal which is processed by the transient digitizer 24 associated with the single anode detector 22.

The microchannel plate 26 is shown in greater detail in FIG. 3B. The microchannel plate 26 is a actually an array of electron multipliers (called channels 27) oriented in parallel to each other. The channel 27 matrix is usually fabricated from a lead glass which is treated in such a way so as to optimize the secondary emission characteristics of each channel 27 and to render the channel 27 walls semiconducting so as to allow charge replenishment. Thus, each channel 27 can be considered to be a continuous dynode structure which acts as its own dynode resistor chain. Parallel electrical contact to each channel 27 is provided by the deposition of a metallic coating, usually Nichrome or Iconel, on the front and rear surfaces, which then serve as input and output electrodes.

A single channel 27 is shown in greater detail in a cutaway view in FIG. 3C. A primary radiator, in this case an ion 8, strikes the inner channel wall 27, which is the catalyst for many electrons 6 to be generated by the single channel 27.

Finally, FIG. 3D shows the relationship between the microchannel plate 26 in combination with the anode detector 22. This figure shows explicitly how the ions 8 striking the microchannel plate 26 generate the electrons 6 which are detected by the single anode detector 22.

In FIG. 3A, the signal information is digitized as it is received from the anode detector 22 by the electronics 24. Digitization is relatively fast, typically on the order of 1 or 2 nanoseconds, and is the reason the transient digitizer 24 is also referred to as a "fast digitizer." Despite the single channel (anode detector 22) aspect, a key advantage of the transient digitizer 24 is that multiple ion hits on the anode detector 22 can be processed. This results in a fairly large dynamic range. Typically, this range is on the order of 8 bits, where $2^8=256$ possible steps.

It is helpful in understanding the advantages of the present invention to first see an example of poor time resolution of the transient digitizer 24 of the prior art. Assume that two ions hit the microchannel plate 26 and are detected by the single anode detector 22 of the mass spectrometer 20 of FIG. 3A. FIG. 1B illustrates these two hits 17 which are very close together in time. Disadvantageously, the transient digitizer 24 of the prior art will not distinguish between these close hits because of pulse broadening in the microchannel plate and the signal handling electronics. Only a single electrical pulse is generated by the single anode detector 22, erroneously indicative of a single hit. In other words, the time resolution of the transient digitizer 24 is no better than the pulse width generated by the detector and its associated electronics 24. Consequently, the digitizer 24 is characterized by mediocre time resolution. Furthermore, the digitizer 24 also has a mediocre signal to noise ratio and signal averaging properties as those terms are understood by one of ordinary skill in the art. The detection limit improves with the square root of the number of averages. In addition, it is very susceptible to baseline noise and drift limitations. Baseline noise can be seen in FIG. 1A as the small but visible disturbances 18 on the waveform 10.

FIG. 2A illustrates the graphical output of an illustrative second type of data acquisition device. The device is known in the industry as a time to digital converter (and which will only be referred to hereinafter as a TDC or TDC converter). The TDC has advantages and disadvantages as compared to the transient digitizer already discussed. However, one of the most serious disadvantages is that a useful output is dependent upon a measured signal being repeated over a relatively longer period of time so that the TDC can signal average to generate a meaningful output waveform. In other words, the dynamic range in the short term (for example, single-shot) is very limited. Surprisingly, however, the dynamic range of the TDC is better overall than the transient digitizer if in addition to signal averaging over a longer time, the signal is relatively small and repetitive, and the TDC receives a substantial number of hits.

The waveform 40 must be assumed to be a signal averaged result which has been processed for a relatively long time period. It should be observed that the waveform 40 is smooth between displayed pulses because unlike the transient digitizer 24, it inherently does not suffer from baseline noise.

The TDC is best characterized as operating to determine when in time a pulse occurs. This operation is analogous to the function of a fast A/D converter. A TDC without summing only provides a sequential series of pulse information. However, this information is more useful when it is then summed in a signal averager to detect the total number of pulses which occur per unit time, much like a counter. Just as in the transient digitizer 24, an electrical pulse is generated each time that an ion strikes the microchannel plate 26 and the anode 22.

It is useful to more precisely describe the signal averaging function of the TDC to also better understand the benefits of the present invention. FIG. 2B is a graphical illustration of hits detected by the plate and anode detector of the TDC during a single period of a repetitive signal. The graphs shows that one hit was detected by the anode at relative time position 1, and two hits were detected at time position 3. FIG. 2C shows a graph of the same repetitive signal in a subsequent time period. There is shown one hit at time periods 1 and 2. Finally, FIG. 2D shows the cumulative signal averaged output of the TDC. The TDC fails to record that two hits occurred at time period three. Although it will be explained in greater detail later, FIG. 2E shows the output of an exemplary embodiment of the present invention. Noticeably present is the display of two hits at time period 3 which the prior art TDC can not show. Thus, FIG. 2E indicates one of the great advantages of the present invention.

Another factor which influences time resolution of the TDC is dead-time. Dead-time is a significant factor in the poor single-shot dynamic range of the TDC, and is typically in the range of 10 nanoseconds because the TDC is unable to process more than one simultaneous hit. Consequently, simultaneous or nearly simultaneous hits register as only one count as indicated by FIGS. 2B–D. Furthermore, under certain conditions the nearly simultaneous hits might be recorded as an average, i.e. At a time intermediate between two closely spaced hits.

While the single-shot dynamic range is poor, the TDC has several advantages over the transient digitizer 20. Significantly, the TDC is immune to noise or baseline drift.

The TDC effectively has a better signal to noise ratio because a single threshold must be reached to even register an ion hit. The electronic circuitry of the TDC is also less expensive to implement than the transient digitizer 20. Most importantly, the TDC has excellent signal averaging properties which improve linearly as the square root of time with respect to the detection limit over time.

A block diagram of the electronic circuitry of the TDC is the same as for the transient digitizer, and is thus also shown illustratively by FIG. 3A. FIG. 3A shows a time of flight mass spectrometer 20 into which ions are injected at injection port 34. A pulsed repeller plate 36 at the end of the chamber 30 nearest the injection port 34 accelerates the ions toward the opposite end of the time of flight tube 32. The movement of the ions is manipulated by the field defining electrodes 38. A microchannel plate 26 in combination with a single anode detector 22 are then used to detect the impact of an ion in a mass spectrometry application. The ion hit typically generates about a million electrons which are detected by the TDC which is shown as the electronics 24 coupled to the anode 22. The electronics 24 respond with an electrical pulse indicative of the ion hit.

Other particle impact detection circuits use multiple detectors such as those found in some imaging systems. However, the imaging systems are only designed to provide positional information, while the present invention provides information relative to time. Therefore, implementation of a multi-anode ion detection system on the present invention represents an improvement in data acquisition for fast transient signals.

To further illustrate the prior art and to serve as another example of how it is to be distinguished from the present invention, FIGS. 4 and 5 both show in a block diagram format how the transient digitizer, the TDC and an imaging system operate. Specifically, FIG. 4 shows the flight path 50 of an ion in a transient digitizer or TDC. The ion strikes the microchannel plate 26, and the electrons generated by the impact are transmitted to the single anode detector 22, and the information is recorded and processed by the electronics 24. FIG. 5 shows that the detectors 56 of an imaging system are arranged such that the photons which are described illustratively by paths 52 and 54 are positionally detected by associated electronics 58.

In light of the unique advantages and disadvantages of each data acquisition device, it would appear advantageous to combine and improve upon the best qualities of each. Specifically, it is desirable to have a time of flight data acquisition device which has a greater dynamic range, improved time resolution, low noise and better signal averaging properties than either a transient digitizer or a time to digital converter, but which can also provide a single-shot scaled waveform output. It would also be an advantage to be able to handle multiple hits to minimize the effects of dead-time by providing a multi-anode time to digital converter.

OBJECTS AND SUMMARY OF THE INVENTION

It is an object of the present invention to provide a method and apparatus for data acquisition having a greater dynamic range.

It is another object to provide a method and apparatus for data acquisition having improved time resolution.

It is another object to provide a method and apparatus for data acquisition having a low noise to signal ratio.

It is another object to provide a method and apparatus for data acquisition having excellent signal averaging qualities.

It is another object to provide a method and apparatus for data acquisition using a multi-anode ion detection system which can process generally simultaneous ion strikes or hits.

It is another object to provide a time to digital converter with a single-shot dynamic range having a scaled waveform output; where a scaled waveform represents a TDC output which can indicate more than a single value at any given moment in time.

In accordance with these and other objects of the present invention, the advantages of the invention will become more fully apparent from the description and claims which follow, or may be learned by the practice of the invention.

The present invention provides a method and apparatus for data acquisition, and in a specific embodiment, time of flight mass spectrometry. A system of multi-anode detectors are used to increase the dynamic range of the TDC. Multiple anodes enables the system to continue detection of ion strikes during the dead time of an individual anode detector which is processing a hit. The data from the multi-anode system is processed so that at each time frame the number of total hits are summed before a time stamp is placed on the data to make a multiple bit word. This approach combines virtually all the advantages of a transient digitizer with the advantages of a time to digital converter when acquiring signals from pulse-based detectors such as detectors utilizing microchannel plates.

In accordance with one aspect of this invention, a plurality of anodes are provided at one end of a flight tube for receiving ions which are accelerated theretowards by a pulse generator/repeller or electrode at the opposite end of the flight tube. The plurality of anodes are arranged in any geometric shape as long as they are disposed for receiving electrical pulses from the microchannel plate, and each is coupled to a different threshold detector. Generally, the anodes are disposed physically parallel to each other.

In accordance with another aspect, the plurality of anodes enable the TDC of the present invention to function in parallel as well. This enables processing of a hit by one detector while the other anodes remain active and able to receive and process other ion hits.

Another aspect of the invention is providing a plurality of anodes in a photon detecting apparatus. In this way, the invention can be used in data acquisition of visual data such as the detection of fluorescent decay rates. Therefore, it should be remembered that whenever the term "ion hit" is used, the term "photon hit" can be substituted.

In another aspect of the invention, the system can compensate for coincidence loss as the result of more than one ion hit on a processing detector during its dead time. Both empirical studies and statistical analysis are used to compensate and extend the linear dynamic range of the invention.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of one preferred embodiment of the present invention will be given numerical designations and in which the preferred embodiment of the invention will be discussed so as to enable one skilled in the art to make and use the invention.

Figure 4:
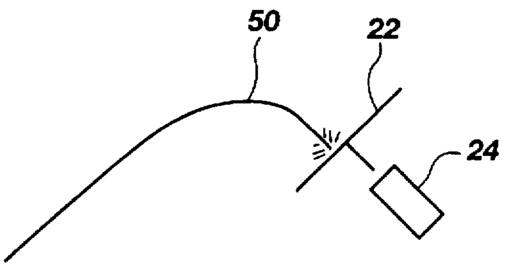
FIG. 4 is a functional block diagram which shows a single anode detector as used in the prior art.
Figure 5:
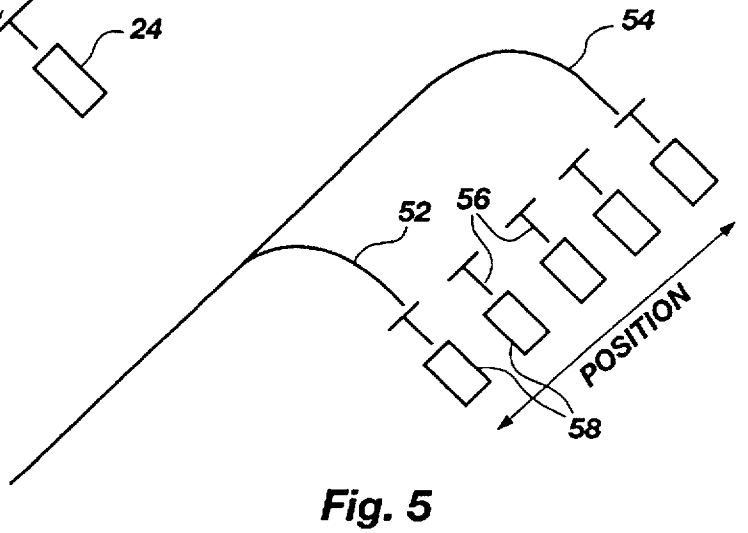
FIG. 5 is a functional block diagram of a multi-detector positional detector as used in the prior art.
Figure 6:
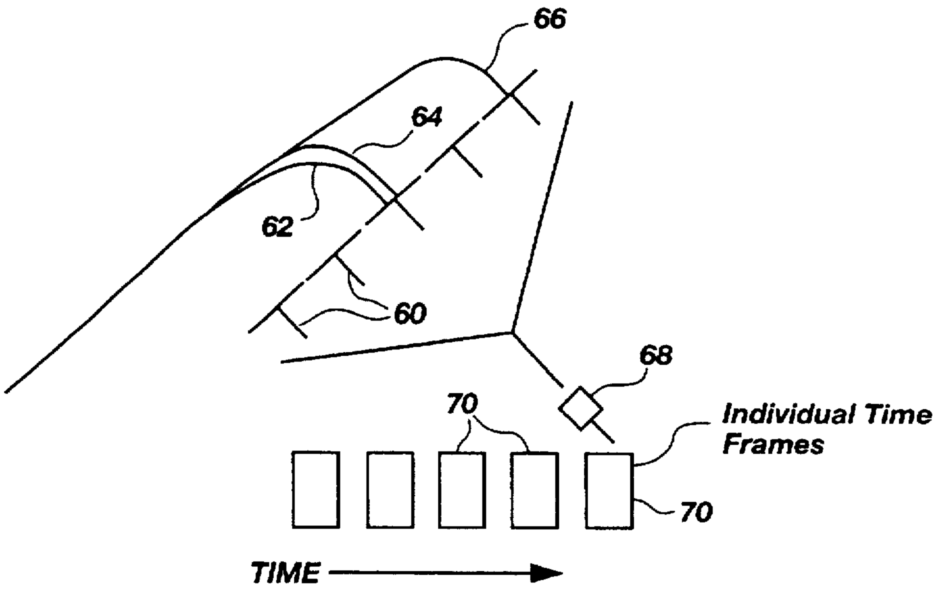
FIG. 6 is a functional block diagram of a presently preferred embodiment of a multi-anode TDC of the present invention.

The present invention is illustrated in block diagram form in FIG. 6. It should be readily apparent that one of the differences between the prior art shown in FIGS. 4 and 5 and this preferred embodiment are the multiple anodes 60 used in a time to digital converter for the detection of ion hits (or other analogous detectors for other particles such as photons.) The representative ions are represented by ion paths 62, 64 and 66. The associated electronics 68, however, are shown differently from the arrangement of FIGS. 4 and 5. This new configuration illustrates the concept in a preferred embodiment that all the ion hits occurring within a predetermined time frame are summed and encapsulated as individual time frames 70. It is even possible that a single time frame might include multiple ion hits on the same anode 4 (via the microchannel plate 26) as shown by the ion flight paths 62 and 64. This recording of ion hits is one of the great advantages of the present invention because it enables the most desirable characteristics of the transient digitizer and the TDC to be advantageously combined in a single data acquisition system as will be explained further.

Figure 1A:
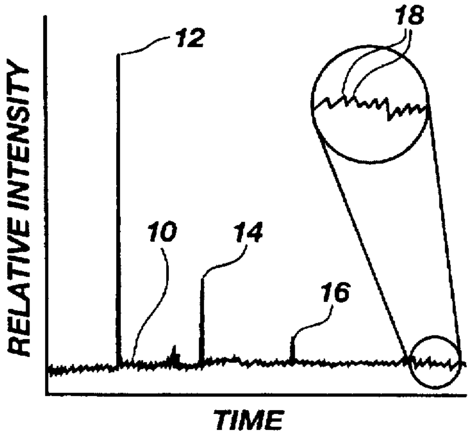
FIG. 1A is a graph of a representative single-shot waveform from the output of a transient digitizer as known in the prior art.
Figure 2A:
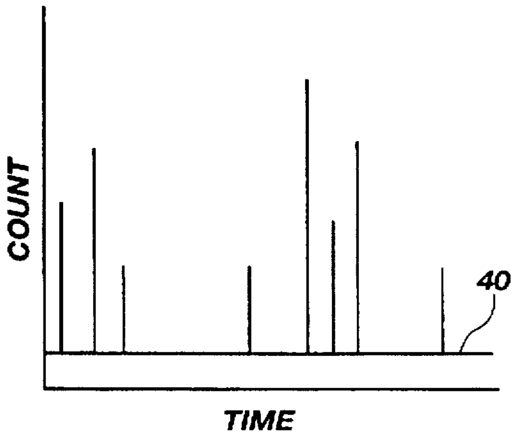
FIG. 2A is a graph of a representative waveform from the output of a time to digital converter (TDC) as known in the prior art after long-term signal averaging.
Figure 3A:
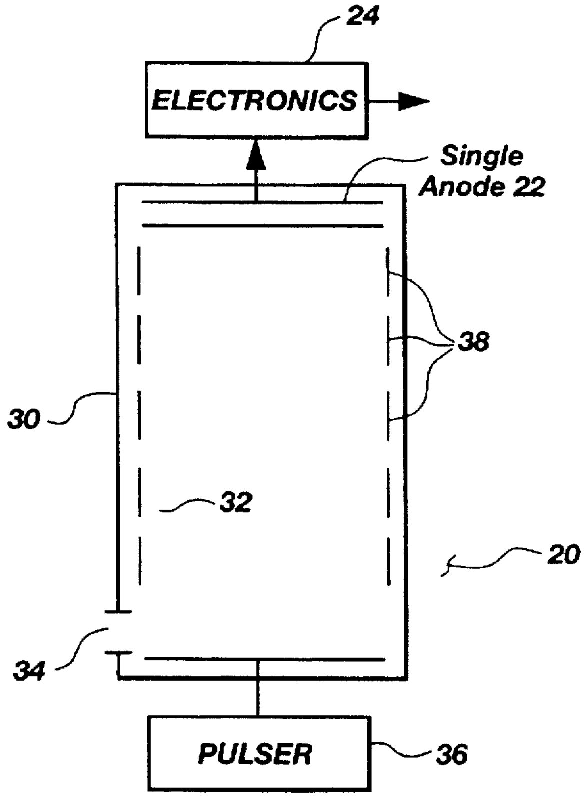
FIG. 3A is a block diagram of the relevant components of a time of flight mass spectrometer and associated electronics which are represented by either a transient digitizer or a TDC as used in the prior art.
Figure 1B:
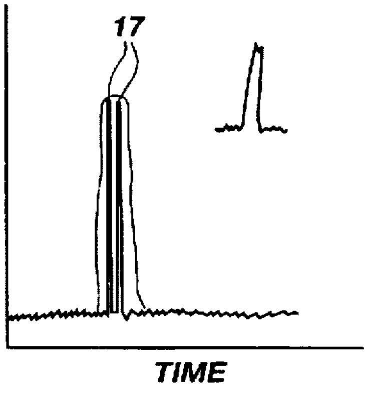
FIG. 1B is a graph of two ion hits relatively close in time.
Figure 7:
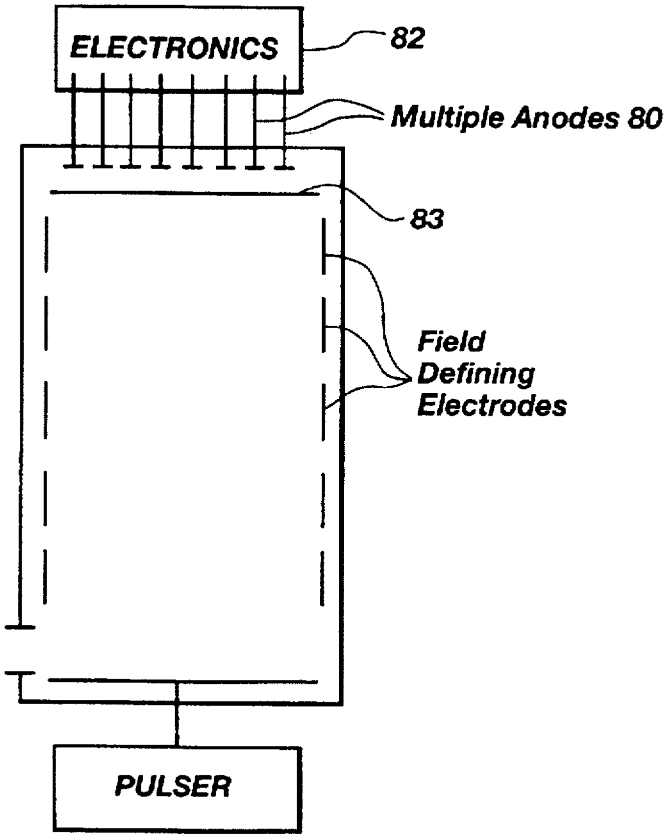
FIG. 7 is a block diagram of a mass spectrometer coupled to a multi-anode TDC made in accordance with the principles of the present invention to increase the linear dynamic range of a data acquisition device.

In conjunction with the block diagram of FIG. 6, the apparatus which makes the present invention possible in this preferred embodiment is illustrated in FIG. 7. One of the most noticeable distinctions between the device shown in FIG. 3A and the preferred embodiment illustrated in FIG. 7 is that there are a plurality of anodes 80 which replace the single anode detector 22. The plurality of anodes 80 enable the system to continue detection of ion strikes during the dead time of an individual anode detector 80 which is processing a hit and is not yet capable of detecting another hit. The data from the plurality of anodes 80 is processed by the associated electronics 82 so that at each time frame the number of total hits are summed before a time stamp (or alternative method of grouping information relative to time) is associated with the data to make a multiple bit word which is a sum representative of all the ion strikes in a time period.

Figure 8:
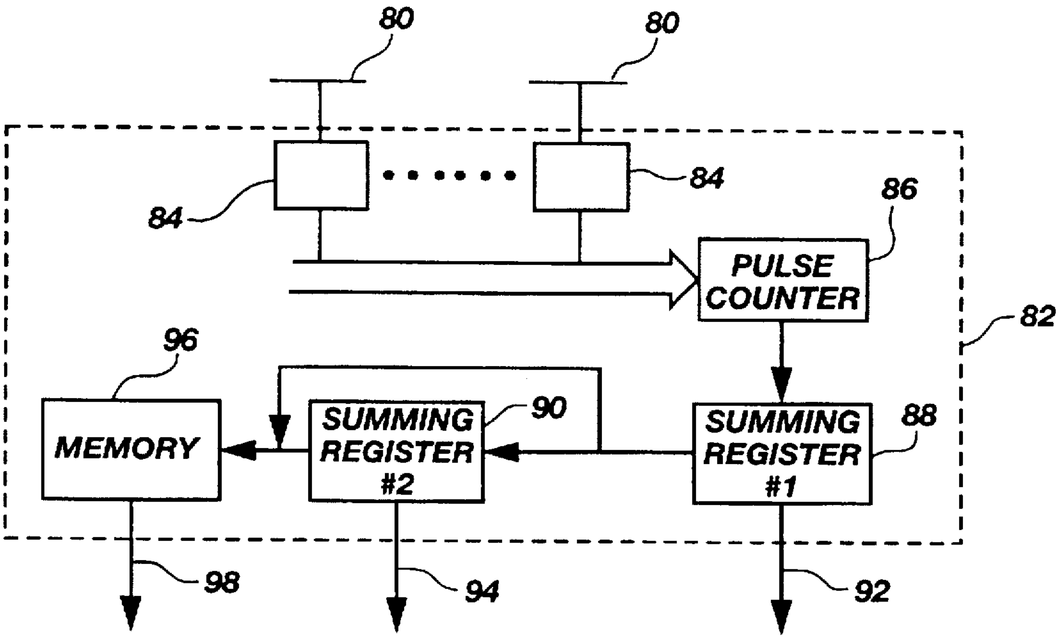
FIG. 8 is a block diagram showing the components in the associated electronics of FIG. 7.

FIG. 8 shows in a functional diagram a preferred example of the associated electronics 82 (see also FIG. 7) in which a plurality of threshold detection circuits 84 are associated with the plurality of anodes 80. In this preferred embodiment, there is a separate threshold detector circuit 84 for each of the anodes 80. The threshold detector circuits 84 are merely one preferred example of a threshold detector means, and are designed to eliminate electrical noise which might otherwise give a false indication of an ion hit on the anodes 80. Therefore, the threshold detector circuits 84 are set to indicate an ion hit only when a sufficiently large electrical impulse generated by the impacting ion is registered. Consequently, it is anticipated that a pulse of electrons produced from an ion hit might be large in diameter as compared to the size of each of the individual anodes 80. When overlap of an ion impact occurs such that the energy delivered by the ion is spread among a plurality of anodes 80, the threshold detectors will discriminate and generally enable only a single anode 80 to register an impact thereon.

One of the important distinctions between the prior art and the present invention is that the ion strikes are now summed during a time frame to create a multiple bit word in a preferred embodiment. The multiple bit word represents a summary of all hits during each time period, slice or frame. Even more advantageously, it is possible to further increase the dynamic range of this multi-anode TDC using dynamic range correction techniques in accordance with another aspect of the present invention which will be described shortly.

The TDC 82, which enables retrieval of data from the plurality of anodes 80, provides a multiple bit word representative of the total number of detected hits by including a pulse counter 86 in combination with a summing or first memory register 88. The pulse detector 86 in a preferred embodiment is a single shot detector as known to those skilled in the art. Furthermore, the first memory register 88 is a memory register or memory buffer, and is organized as a binary tree which can easily change the value stored therein to thereby generate an output which is indicative of the sum of all ion hits detected.

The function of the pulse counter 86 is to transmit a pulse which is interpreted by the summing register 88 as an additional ion hit which is added to the value stored therein by incrementing through any one of a number of methods well known in the art. This first memory register 88, however, is only used to store the current number of electrical pulses received during the current time frame. When the end of the time frame is reached as determined by a clock (not represented in FIG. 8) in the TDC converter, the value stored in the first memory register 88 is either 1) transferred to a second memory register or summing register 90 which holds in memory a single additive accumulation of pulses detected in multiple previous time frames, 2) used to generate as an output a single multiple bit word 92, or 3) transferred directly to a larger memory 96 whose function is to be discussed shortly. If the multiple bit word 92 is stored in the second memory register 90 or the memory 96, a time stamp is typically associated with the data for purposes of creating a single shot output waveform such as the waveform shown in FIG. 2E. The time stamp defines when the pulse count total was recorded in relation to all other pulse count totals.

Before continuing, it should be explained that a time stamp is only one method of storing data such that it can be recalled sequentially. For example, a linked list, memory stack, array or any other memory device or method used to store data can be used which, by the very nature of its position in a memory device, can also define a relational position in time with respect to other data. In other words, the time of recording data is implicit by the order in which the data is saved in a memory. Consequently, if a relative time position is all that is required, it is only necessary to store data such that it can be recalled in the order in which the data was created. The data can then be recalled to overlay a time scale which is incremented in units of time representative of when the data was stored.

Continuing with the description of memory 96 and memory registers 88 and 90, the second memory register 90 is also capable of accumulating a single additive sum which is the sum of at least two multiple bit words generated by the first memory register 88. If a time stamp is used, the time stamp remains associated with the value in the second memory register 90 until it is recalled as a single output 94, or it is passed, in the preferred embodiment with the time stamp to the memory 96.

Unlike the first and second memory registers 88 and 90, the memory 96 is a larger dynamic memory space which enables the storage of many multiple bit words as generated by either the first or the second memory registers 88 and 90. The memory 96 is any memory device which can store data such that it can be recalled sequentially. This does not mean that the data must be stored sequentially, but rather that it can be recalled in the order in which it was stored according to the time stamps associated with the data stored therein. This recall of data in the order in which it was stored might be implicit if it is based upon the order in which data was stored. For example, the memory 96 can be used to create arrays or linked lists as understood by those skilled in the art. However, a randomly accessible memory can also be used to recall data in the order in which it was stored. One skilled in the art should also realize that if the memory 96 is randomly accessible, the first memory register 88 and the second memory register 90 can be specific memory addresses within the memory 96.

Figure 2B:
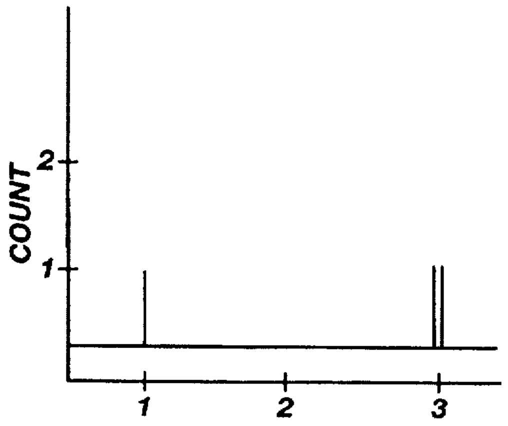
FIG. 2B is a graph showing detection of ion hits in a first time period of a repetitive signal.
Figure 2C:
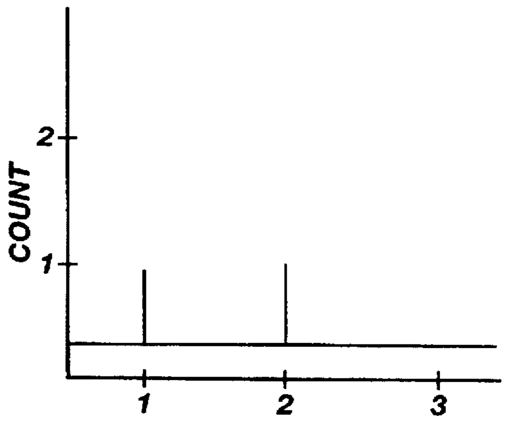
FIG. 2C is a graph showing detection of ion hits in a second time period of a repetitive signal.
Figure 2D:
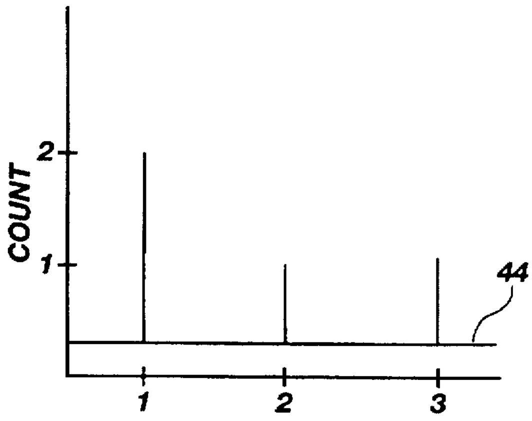
FIG. 2D is a graph showing the signal averaged signal of FIGS. 2B and 2C by a TDC of the prior art.
Figure 2E:
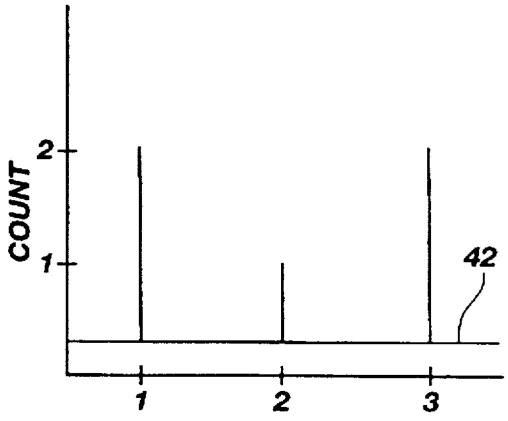
FIG. 2E is a graph showing the signal averaged signal of FIGS. 2B and 2C when the TDC of the prior art is replaced with an exemplary embodiment of the present invention.
Figure 3B:
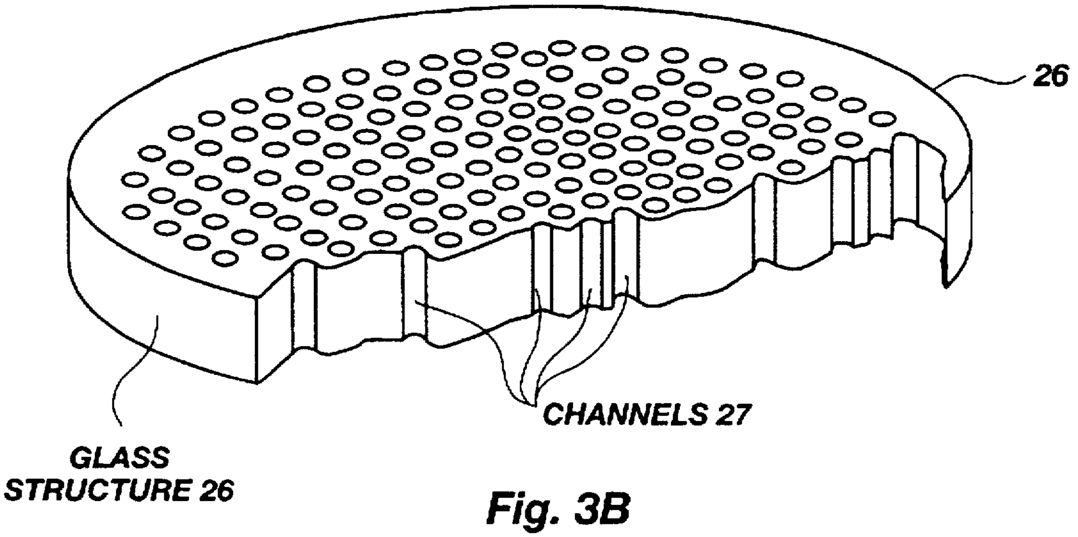
FIG. 3B is a perspective cut-away view of the microchannel plate of FIG. 3A.
Figure 3C:
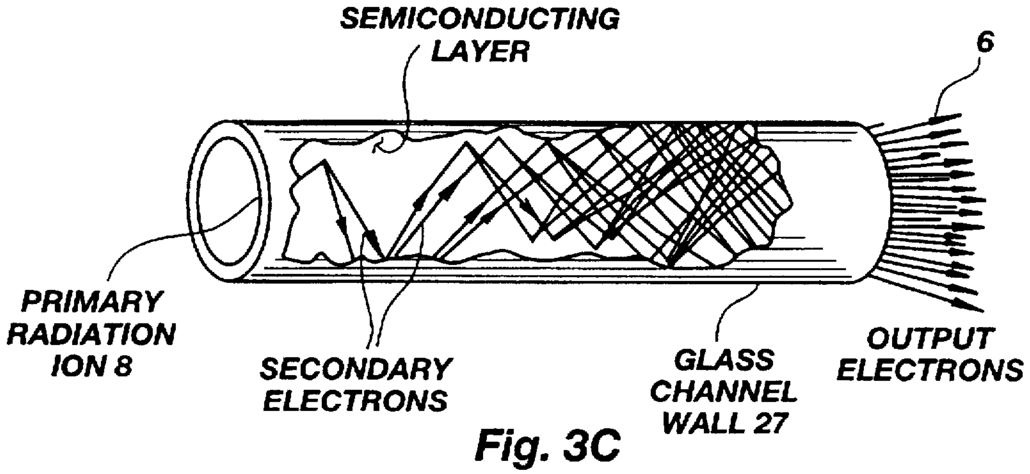
FIG. 3C is a close-up perspective cut-away view of the detail of a single microchannel shown in FIG. 3B.
Figure 3D:
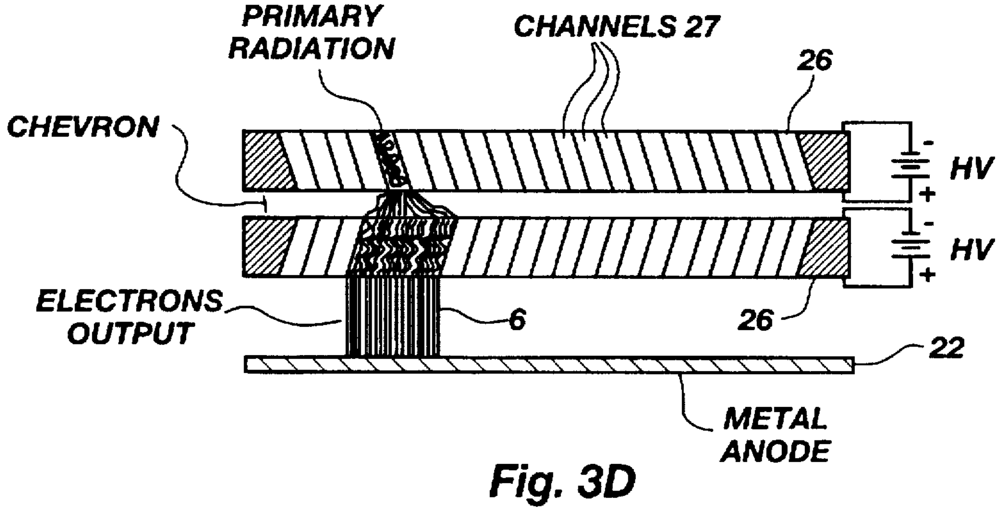
FIG. 3D is an illustration of a microchannel plate shown in relation to a single anode detector, and provides detail of how an ion impact on the microchannel plate is detected by the anode detector.

The importance of recalling data in the order in which it was stored is important because it enables the creation of output, such as on a display, of this time-organized data. It should thus be apparent that the data stored in the memory 96 is what is recalled at output 98 to generate the single-shot waveform as shown in FIG. 2E. Nevertheless, it is important to realize that sequential recall can be accomplished in many different ways, both utilizing various devices as well as various methods, and that the example should not limit the invention.

Another concept which has been implied is the realization that the memory 96 need not be a randomly accessible memory. Because data must be capable of being recalled sequentially, a linearly accessible memory means might also be used. For example, bubble memory could be used as memory 96.

A single-shot output waveform which is typical of the output generated by the present invention is illustrated in FIG. 2E. Unlike the prior art, the TDC of the preferred embodiment of the present invention is able to register both nearly simultaneous ion hits at time period 3 of FIG. 2B. Consequently, the total count at time period 3 of FIG. 2E reflects this count of two hits. Therefore, the preferred embodiment includes a much more accurate TDC than exists in the prior art.

It will now be appreciated that the preferred embodiment of the present invention provides greatly improved performance over the prior art transient digitizer. Specifically, the preferred embodiment has an improved dynamic range over a TDC, and improved time resolution as compared to a transient digitizer.

Figure 9B:
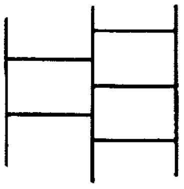
FIG. 9B is an alternative arrangement of detectors used in the present invention.
Figure 9A:
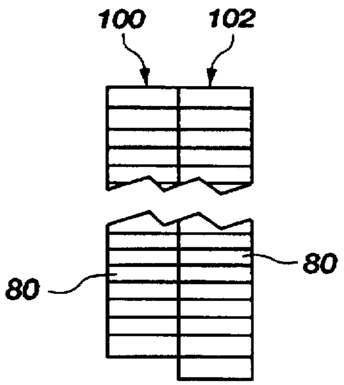
FIG. 9A is a preferred arrangement of detectors used in the present invention.

Turning to the specific physical placement, configuration or orientation of the plurality of anodes 80 shown in block diagram form in FIG. 7, the present invention teaches that the plurality of anodes 80 can be arranged in any desired pattern. Necessarily, the specific application of a multi-anode TDC converter will dictate anode placement. In a preferred embodiment, the anodes are placed so as not to overlap so that the surface area of each anode 80 exposed to ions is the same, as shown in FIG. 9A.

It is a further specific arrangement of anodes 80 that they are arranged in two columns where a first column 100 has 31 anodes and a second column 102 has 32 anodes. The columns 100, 102 can be arranged so as to be offset by approximately one half the length of any single anode 80 to create the pattern shown in FIG. 9B. The columns 100, 102 can also be arranged so as not to be offset and thus present the pattern shown in FIG. 9A.

Some of the considerations which should be factors in determining the specific arrangement of the anodes 80 are the size of the individual anodes, the total area where ions can hit which therefore must be covered by anodes, the shape of the area (such as arranging anodes in a column or in a circular pattern) which can be hit by ions, spot size (area of the anode which can be affected by an ion impact on a microchannel plate), the physical constraints of circuitry associated with the anodes, and the ion beam profile. It should be apparent from this non-exhaustive list that the applications for the multi-anode TDC of the preferred embodiment will clearly dictate to one skilled in the art the specific geometry selected for arranging the anodes (and by implication, the microchannel plate which is actually being hit by the ions).

Figure 10:
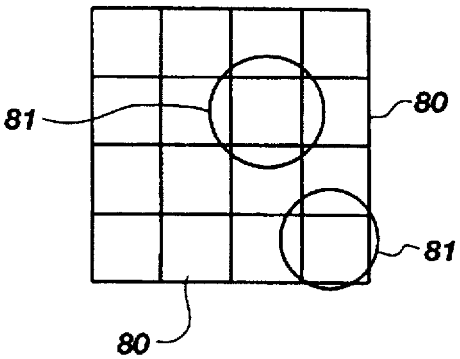
FIG. 10 is another alternative arrangement of detectors used in the present invention which shows the relationship between detector size and impact area of a particle being detected.

FIG. 10 demonstrates that the size of the anodes 80 is also relevant to the present invention in that ions (and photons) create a measurable area of impact (spot size) on the microchannel plate, and thus the anodes below (or wherever they are placed in relation to the microchannel plate). It should also be observed that the pattern of anodes 80 is shown configured as a square instead of the columns of FIGS. 9A and 9B. This illustrates the concept that the anodes can be configured in a pattern which is most appropriate for a particular application.

The area of impact (defined as the pulse of electrons generated by impact of the ion on the microchannel plate) of an ion being detected is shown as circles 81. If the size of the anodes 80 (or relevant detector) is large in relation to the impact area 81 of the particle striking them, there is less chance that a single particle will cause more than one anode 80 to generate an electrical signal representative of an particle striking it. However, if the anodes 80 are closer in size to the measurable area of impact as shown here, then the odds increase that more than one anode 80 will detect a hit. Quite clearly here, the impact size 81 could envelope portions of up to nine anodes 80. However, the amount of energy delivered to each anode 80 will vary greatly. Sensitivity of the device can be adjusted accordingly so that a threshold level of energy must be attained before an impact will register as a hit. Another way to think of this concept is that a particular percentage of the anode must fall within an impact area 81 before the anode will detect an ion hit.

Figure 11:
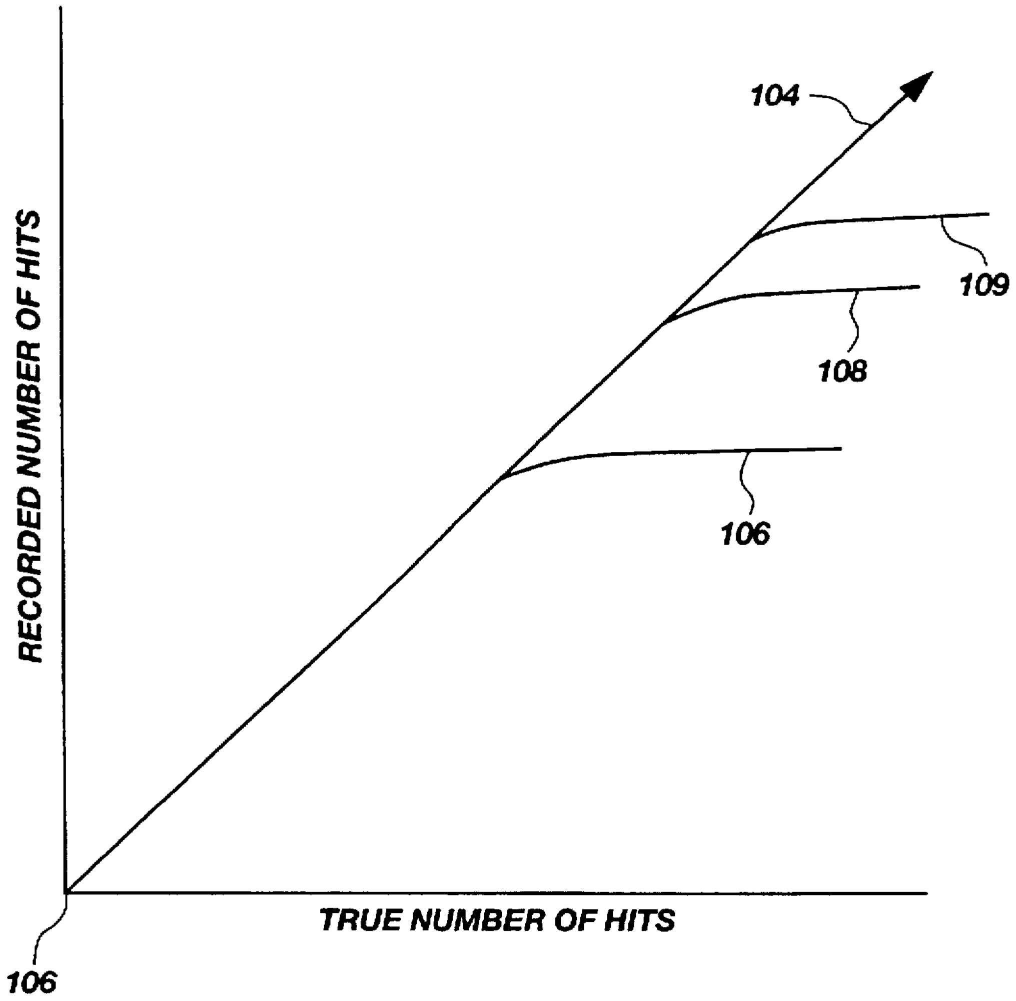
FIG. 11 is a graph which is not to scale but which illustrates the extended linear dynamic range of the present invention as compared to the dynamic range achieved by a TDC of the prior art.

Before discussing the advantages of the present invention further, it is helpful to examine FIG. 11 which is a comparison of the dynamic range of the prior art devices, the present invention without using dynamic range compensation techniques and the present invention using such techniques. This graph thus most easily demonstrates one of the main aspects of the present invention. Specifically, by providing multiple anodes, the dynamic range and the time resolution of the present invention are improved.

As understood by those skilled in the art, the dynamic range being referred to is the relationship between the recorded number of ion hits (on the y-axis) detected by the data acquisition device versus the actual or true number of hits (on the x-axis). It is more helpful, however, to see this relationship as described earlier. Specifically, it is the ability to measure attributes of both large and small signals without distortion of the signal which normally occurs with large signals, or the obscuring of the signal by noise when the signal is small. An ideal dynamic range would be represented by a straight line 104 proceeding at a 45 degree angle from the point of origin 106 of the x and y axes. This would be indicative of a data acquisition device which is able to detect and record all signals, both large and small, a perfect correspondence.

Empirical results as illustrated by the graph of FIG. 11 show that data accumulation devices of the prior art have dynamic ranges 106 which eventually depart from the ideal 104. The line 107 is shown to represent the dynamic range of the prior art devices which use some type of compensation technique to extend the accuracy of the measurements. The graph of FIG. 11 is not drawn to scale, but effectively illustrates the increase in dynamic range achieved by the present invention. This is illustrated by a comparison of lines 106 and 107 which are the lower dynamic ranges (earlier departure from ideal line 104) versus the higher dynamic range of line 108. Line 108 is representative of the higher dynamic response achieved by the present invention only as a result of the multi-anode design. In other words, the actual number of hits is more accurately reflected by results of the present invention because it is better able to measure attributes of small and large signals by using a multi-anode TDC. Line 109 is shown to represent an even more improved dynamic range which can be achieved by the present invention if the system compensates for coincidence loss. The system can compensate for coincidence loss using some type of compensation means. In the preferred embodiment of the present invention, the compensation means uses statistical analysis or past empirical results to provide a compensation factor, as understood by those skilled in the art, which delays deviation from the ideal line 104.

In order to extend the dynamic range of the present invention using a compensation factor as described above, the multiple anode TDC converter must process the actual data measurements recorded in all parts of the memory to thereby generate a compensation factor to provide the corrected (compensated) output. The data processing can be accomplished by providing a microcontroller, microprocessor or even hard-wired logic, depending upon such factors as the nature of calculations to be performed, speed of the TDC, etc. These data processing devices will use the actual data, for example, by cross-referencing it with statistical data stored in memory.

For example, if a look-up table is used to cross-reference actual data with previous statistically calculated or empirically measured numbers of additional but undetected ion hits, the calculations performed by the processing devices are likely to be limited to relatively simple addition of the compensation factor to the actual data. However, if the processing devices are required to do less than minimal calculations, they might require more significant capabilities. For example, statistical calculations based on empirical results can require significant manipulation to obtain an output. Therefore, implementation of the present invention requires that the method of processing to be used to obtain a compensated output be estimated so as to determine whether a microcontroller, microprocessor or hard-wired logic is to be applied.

The present invention can be classified, so to speak, by quantifying to what degree the dynamic range of the present invention is increased. It is proposed that as understood by those skilled in the art, the TDC converter of the present invention has a dynamic range equal to the number of anodes which are used in its construction in cases where dynamic range correction using a compensation factor is not used. Consequently, the preferred embodiment of the present invention is a multiple anode TDC converter having a dynamic range increased by a factor of 63. This quantification can be appropriately applied, however, to any multiple anode TDC converter. Furthermore, the factor of 63 should not be considered limiting, but rather an example of what can be achieved. It should also be observed that this factor might also be adjusted because of the compensation factor which can make the preferred embodiment of the present invention have an even better dynamic range and improved time resolution than the actual number of multiple anodes can account for.

The apparatus of the present invention has been explained in sufficient detail for one skilled in the art to make the invention. However, in order to gain greatest benefit from the use of the present invention, the skilled practitioner will benefit from other particular aspects of the method of use of the present invention as further disclosed hereinafter.

Figure 12:
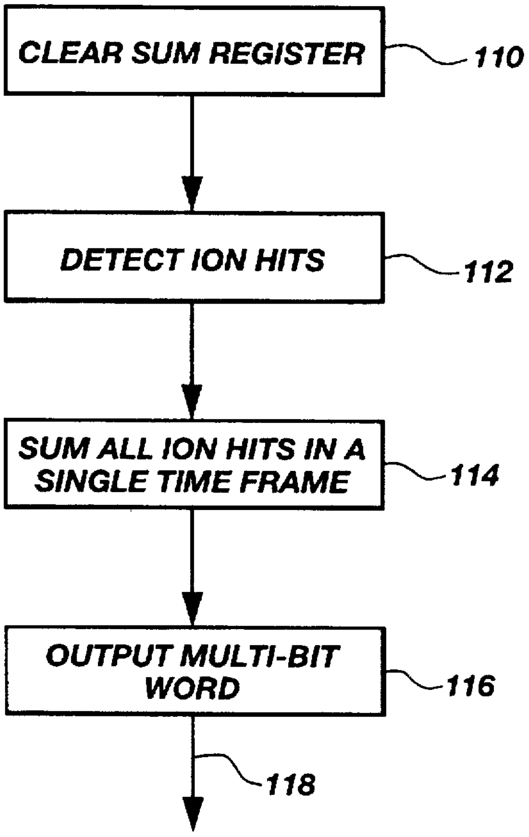
FIG. 12 is a flow chart showing one preferred method of the present invention to detect particles hitting a detector and generating a multiple bit word representative of a total number of hits which occur within a predetermined time frame.

FIG. 12 shows in a flowchart the minimal steps executed in the preferred embodiment of the present invention. These minimal steps do not provide TOF data, but are used instead to generate a single multiple bit as the output. The method includes the step 110 of clearing a sum register (first memory register), detecting at least one ion hit on one of the plurality of anodes in step 112, summing all detected ion hits in step 114, and generating as an output 118 in step 116 the sum (in the form of a multiple bit word) stored in the summing register 88. It should be noted that it is also possible to limit detection to no more than one hit per anode instead of using only a predetermined time frame to determine when a new recording period is to begin.

The process generally described above can be analogized to an Analog to Digital (A/D) converter, with the difference being that instead of digitizing an analog signal, a digital value equal to the total number of ion hits at a specific time or within a small period of time is generated.

Figure 13:
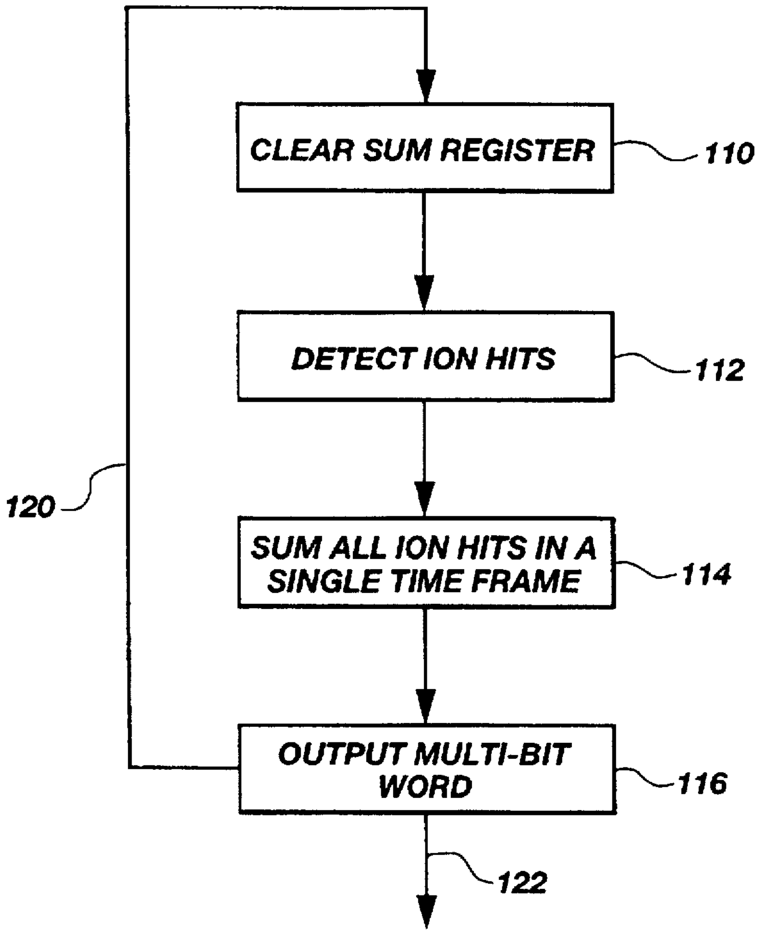
FIG. 13 shows an additional step to the method of FIG. 12 in a preferred embodiment of the present invention.

FIG. 13 is almost identical to FIG. 12, but has been modified by the addition of step 120. Step 120 introduces the concept of a loop in the detection and summing process to generate as an output 122 a series or plurality of multiple bit words. This method is thus analogous to a repetitively clocked A/D converter which does not store the output.

Figure 14:
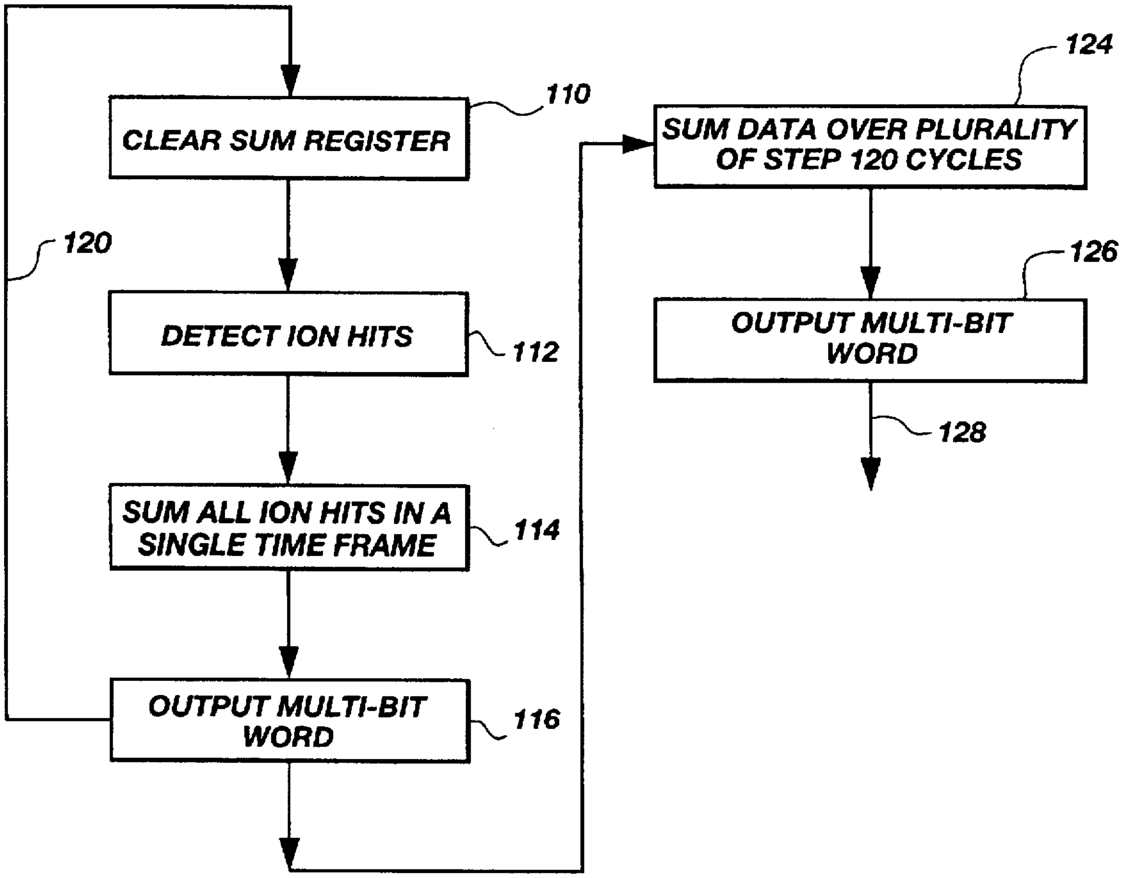
FIG. 14 shows additional steps to the method of FIG. 13 in a preferred embodiment of the present invention.

FIG. 14 provides additional steps to the flowchart of FIG. 13. The output 122 of a plurality of multiple bit words is summed in step 124 during a plurality of loops of step 120. It is assumed that the second memory register 90 (FIG. 8) where the summing of step 124 occurs has been cleared in step 124 before summing begins. When a predefined number of loops of step 120 have been summed in the second memory register 90, the second memory register 90 provides as an output 128 in step 126 a single multiple bit word which is the sum of all ion hits during the plurality of step 120 cycles.

This method is useful, for example, in the following scenario. Assume that there is a light source which is dynamically varying, and it is desired to know the total number of photons emitted from this light source during a particular interval of one microsecond duration. If the detectors are photon detectors such as an array of avalanche photo diodes instead of anodes (as explained previously), the output 128 will be a single multiple bit word representative of the total number of photons detected.

Figure 15:
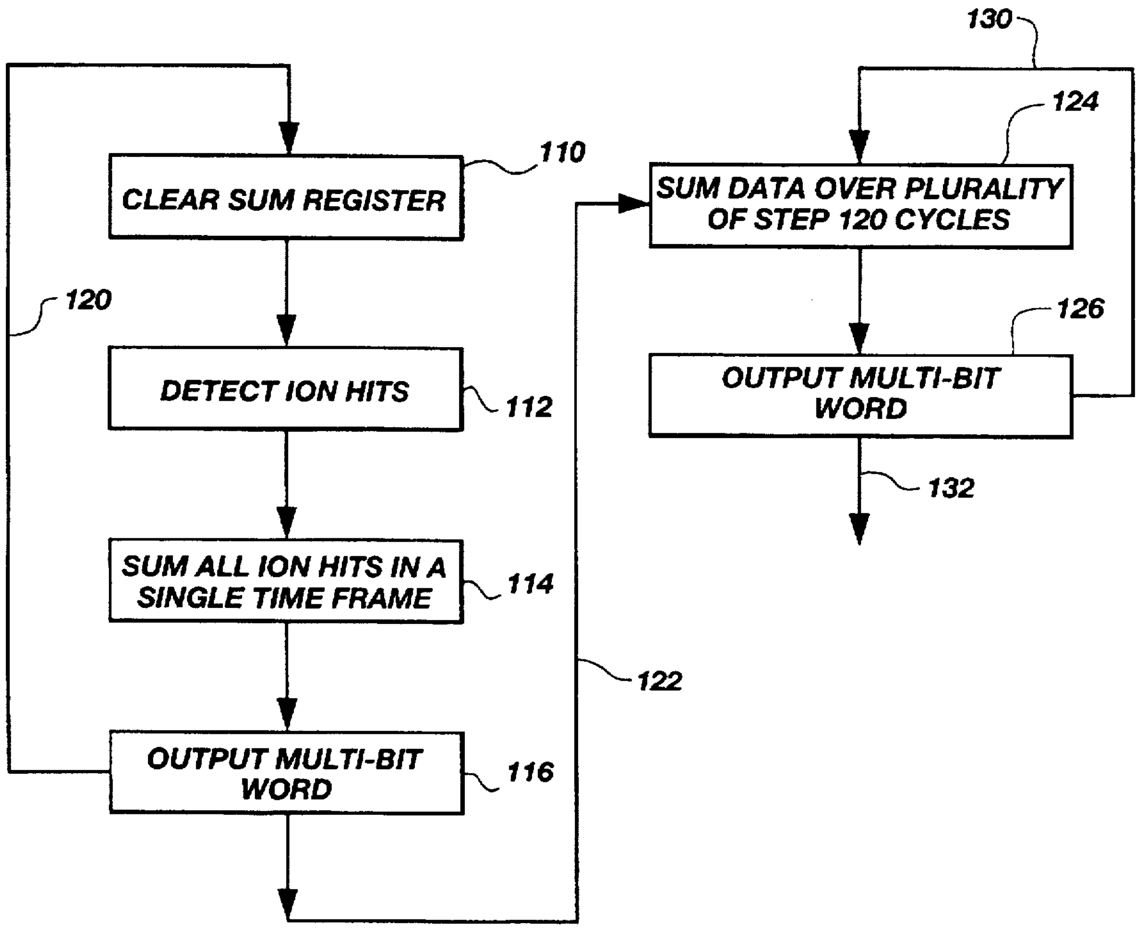
FIG. 15 shows additional steps to the method of FIG. 14 in a preferred embodiment of the present invention.

FIG. 15 is analogous to the modification in steps between FIGS. 12 and 13. In other words, the additional step 130 is a repeating loop so that a series or plurality of multiple bit words 132 are generated from the second memory register 90 where each multiple bit word appears at the end of each complete cycle 130.

Figure 16:
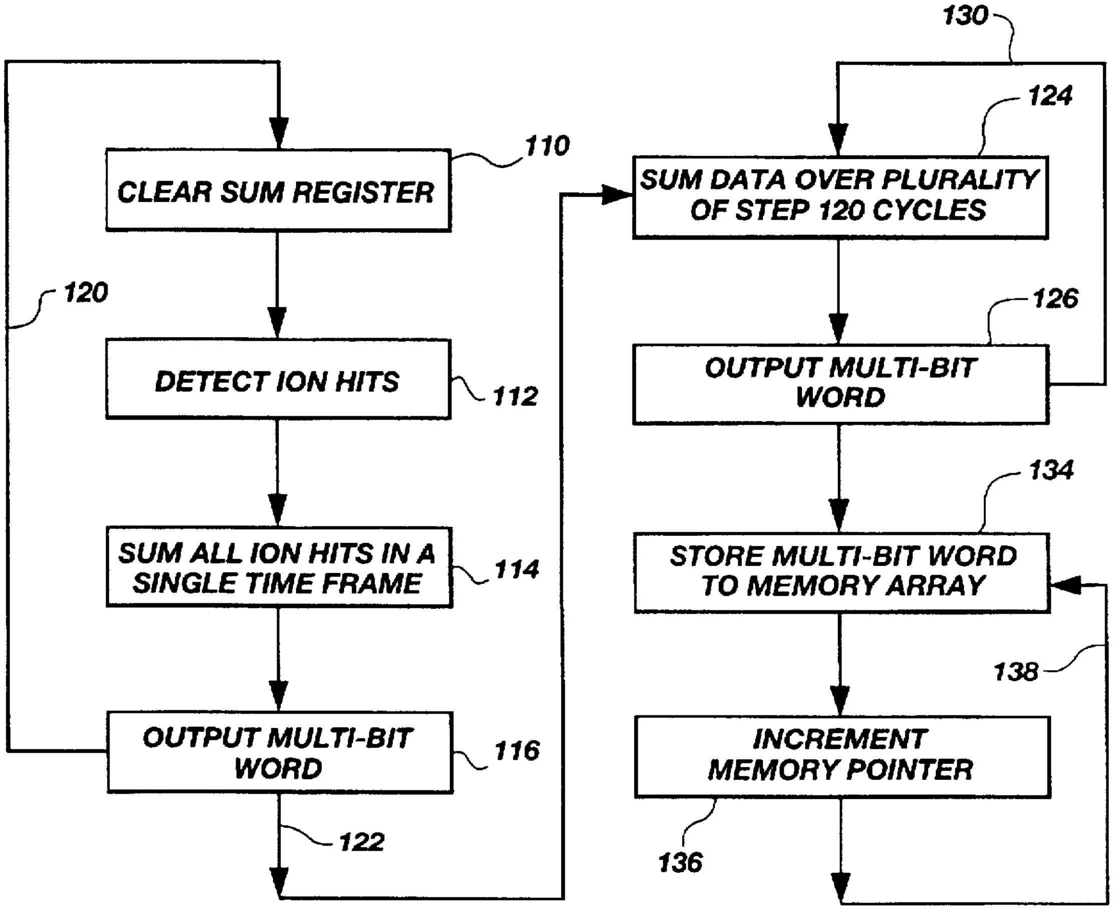
FIG. 16 shows additional steps to the method of FIG. 15 in a preferred embodiment of the present invention.

FIG. 16 shows an additional set of steps added to the steps shown in the flowchart of FIG. 15. The flowchart shows that in new step 134, the plurality of multiple bit words 132 generated from the second memory register 90 register of FIG. 15 are stored in memory in step 134. A memory pointer is then incremented in step 136 to point to a next memory storage address. The cycle of step 138 is executed each time that a new multiple bit word is stored in the memory array.

Any method of data storage and any memory hardware can be used as long as the combination results in the data being recalled sequentially when it is needed. However, it is not necessary that the data itself actually be stored sequentially. In other words, the data could be stored in an array which is formed of sequential memory addresses, or it can be stored in a linked list arrangement where individual memory addresses can reside anywhere in memory, but which are linked so as to always point to the next sequentially related data regardless of where it has been stored.

Figure 17:
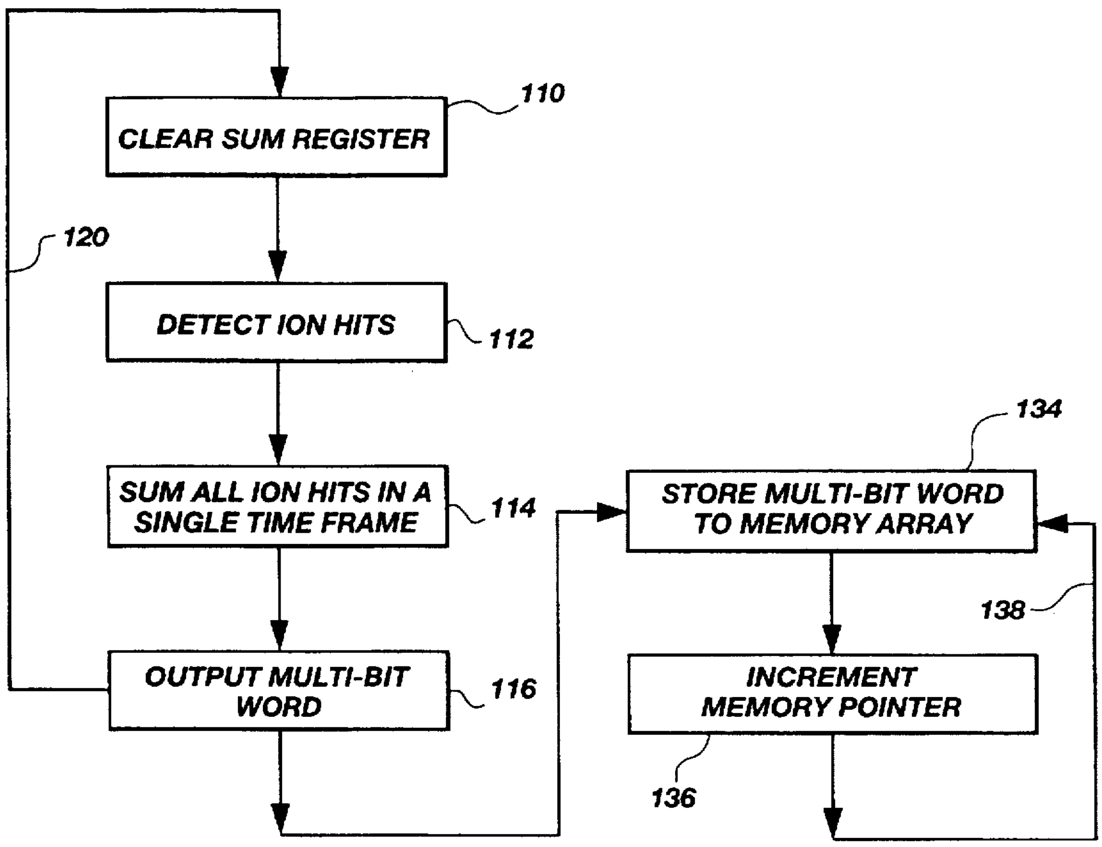
FIG. 17 shows additional steps to the method of FIG. 16 in a preferred embodiment of the present invention.

While the new steps outlined in the flowchart of FIG. 16 have been stated as being coupled to the output 132 of FIG. 15, the present invention, as shown in FIG. 17, can also have the output 122 of FIG. 13 function as the source of multiple bit words which are stored in step 134 as sequentially retrievable data. This method eliminates a layer of summing introduced by FIG. 14 which may be extraneous to the purposes of the present invention in certain applications.

Figure 18:
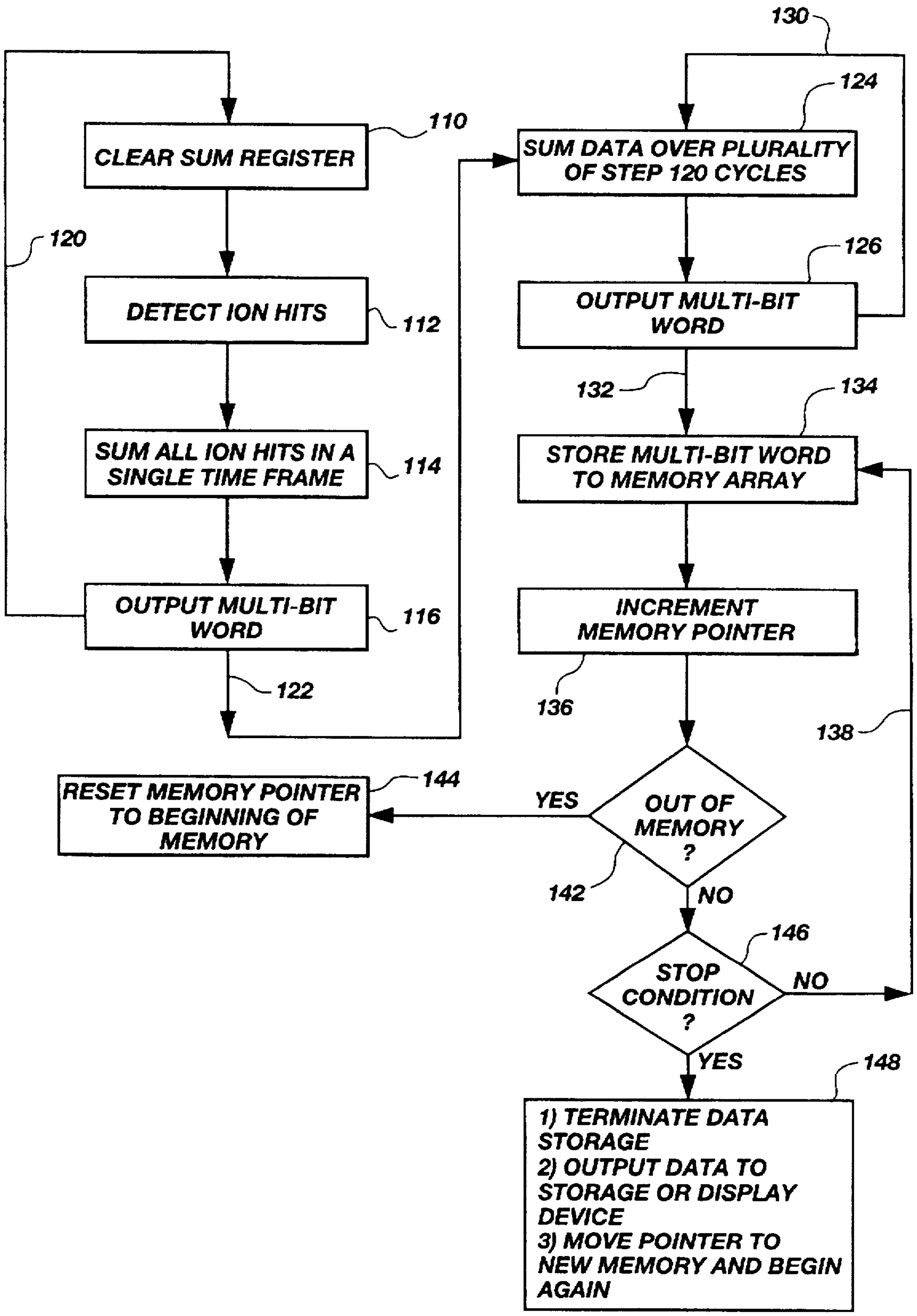
FIG. 18 shows additional steps to the method of FIG. 17 in a preferred embodiment of the present invention.

FIG. 18 describes the method of summing a repetitive transient signal. This final flowchart is a modification of the steps of FIG. 16. The flow charts are similar in that when additional multiple bit words are presented at the present memory location pointed to by the memory pointer, the value stored in the present memory location and the additional multiple bit word are summed and overwrite the value stored in the present memory location.

However, new step 142 determines if an out of memory condition exists. If the result is affirmative, the memory pointer is reset in step 144 to the first location in memory where data is stored so that data can be overwritten from the beginning so that the oldest data is overwritten first.

It should be noted that before overwriting memory, step 146 verifies that no stop condition has been encountered. A stop condition might be, for example, expiration of a predetermined time frame over which the detection of ions or photons is to occur.

When a stop condition is encountered, one of three steps is executed as shown in step 148. First, the data can be left intact in memory and the recording of data terminates. Second, the data stored in memory can be output to, for example, a storage device or display device. The third option is to move to another region of memory or another storage medium to begin again, leaving the old data intact.

In summary, the present invention provides an improved method and apparatus for summing a repetitive transient signal. This is accomplished by increasing the dynamic range and time resolution of a TDC converter by providing a plurality of anodes and associated circuitry to generate a multiple bit word generally equal to the total number of ion hits detectable within a predetermined time frame. Digital pulses derived from the electrical signals which are generated as a result of an ion hit on a microchannel plate and registered by at least one anode, are counted or digitally summed during predetermined and generally equal time frames. The present invention then generates a multiple bit word representative of the total number of hits for each time frame. All or a portion of the individual time frames are then displayed as a single-shot waveform. However, the data can be manipulated to produce results which can provide more than just time of flight (TOF) data in a mass spectrometer. It should also be realized that the method and apparatus accomplish data acquisition having a low signal to noise ratio and excellent signal averaging qualities.

The preferred embodiment of the present invention also provides a method and apparatus for data acquisition using a multi-anode ion detection system which processes generally simultaneous ion hits, and provides a scaled waveform output, where a scaled waveform represents a TDC output which can indicate more than a single value at any given moment in time.

Figure 19:
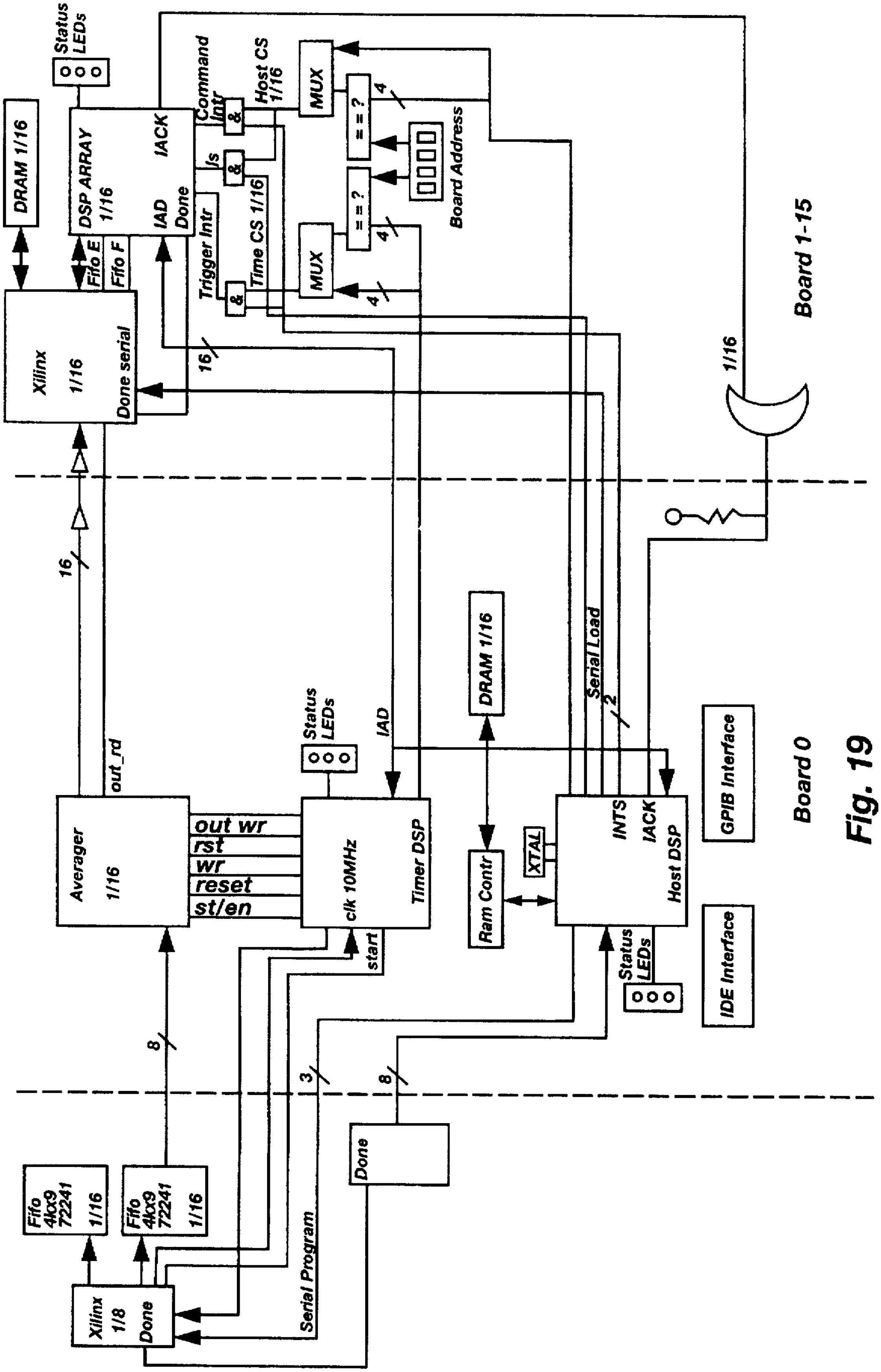
FIG. 19 is a schematic diagram illustrating the circuitry in the preferred embodiment of the present invention as disclosed hereinafter.

A circuit diagram of the preferred embodiment of the present invention is included as FIG. 19 to show more explicitly the precise manner in which the circuitry is implemented. The following detail is now provided to more explicitly define the labels and connections used to identify the circuits shown in FIG. 9. Beginning at the far left of FIG. 19, there are two first in first out (FIFO) stack queues 200, 202 which have 16 bits data input lines coupled to a Xilinx integrated circuit 204 (IC). The Xilinx IC 204 receives input from and sends output to Board 0 (zero) 206. Board 0 206 contains an averager IC 208, a timer digital signal processor (DSP) 210 with a status LED 212 coupled thereto. There is also a Host DSP 214 having a random access memory (RAM) controller 216 with an associate Dynamic RAM 218. The Host DSP 214 also has a status LED 220, as well as an IDE bus interface 222, and a GPIB bus interface 224.

Boards 1–15 226 each have another Xilinx IC 228 with associated DRAM 230. The Xilinx IC 228 communicates with a Digital Signal Processing array 232, which has its own status LEDs 234. There are also logic gates 236 which control input and output to the other components on boards 1–15 226, and to board 0 206.

It is to be understood that the above-described embodiments are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A time-to-digital (TDC) converter having increased dynamic range and time resolution for more accurately determining time relevant characteristics of a stream of particles, said TDC comprising:

a first detector means for detecting impact of the stream of particles on a surface thereof, wherein the impact generates a first electrical signal from the first detector means;

a second detector means for detecting impact of the stream of particles on a surface thereof, wherein the impact generates a second electrical signal from the second detector means;

at least another detector means for detecting impact of the stream of particles on a surface thereof, wherein the impact generates at least another electrical signal from the at least another detector means, wherein the first detector means, the second detector means and the at least another detector means are members of a plurality of detector means for detecting the impact of the stream of particles on surfaces thereof, and wherein the detection of the stream of particles generates a first plurality of electrical signals from the plurality of detector means and wherein the stream of particles impacting on each of the plurality of detector means is characterized as a repetitive transient signal wherein each of the plurality of detector means is further comprised of:

a microchannel plate disposed to thereby receive the stream of particles on a surface thereof, and generate the first plurality of electrical signals in response to the stream of particles;

a first anode electrically coupled to the microchannel plate to thereby receive and process the first electrical signal to thereby generate a first processed electrical signal;

a second anode electrically coupled to the microchannel plate to thereby receive and process the second electrical signal to thereby generate a second processed electrical signal;

at least another anode electrically coupled to the microchannel plate to thereby receive and process the at least another electrical signal to thereby generate at least another processed electrical signal; and wherein the first processed electrical signal, the second processed electrical signal and the at least another processed electrical signal represent the time relevant characteristics of the stream of particles and wherein the first anode, the second anode and the at least another anode are members of a plurality of anodes which process the first plurality of electrical signals to thereby generate a second plurality of processed electrical signals; and a means for processing the first electrical signal, the second electrical signal, and the at least another electrical signal by receiving said first, said second, and said at least another electrical signals and determining the time relevant characteristics of the stream of particles generally without distortion of the time relevant characteristics which occurs with large signals, and generally without obscuring by noise of the time relevant characteristics which occur with small signals wherein the means for processing the first plurality of electrical signals is further comprised of a plurality of threshold detector means for enabling each of the first plurality of electrical signals which exceeds a selectable threshold energy level to be generated from the plurality of anodes as the second plurality of processed electrical signals.

2. The TDC converter as defined in claim 1 wherein the stream of particles is selected from the group of particles consisting of ions and photons which impact on the plurality of detector means.

3. The TDC converter as defined in claim 2 wherein the first electrical signal is generated from the microchannel plate at a point of impact, and is then received by the first anode on a surface thereof which is generally aligned with the point of impact.

4. The TDC converter as defined in claim 1 wherein the means for processing the first plurality of electrical signals to determine the time relevant characteristics thereof is further comprised of a counting means electrically coupled to the plurality of threshold detector means for processing the second plurality of processed electrical signals to thereby generate a pulsed electrical signal which can be summed.

5. The TDC converter as defined in claim 4 wherein the means for processing the first plurality of electrical signals to determine the time relevant characteristics thereof is further comprised of a first memory register coupled to the counting means which sums a total number of the pulsed electrical signals generated within a selectable time frame, and generates at least one multiple bit digital word representing the total number of the pulsed electrical signals at an output thereof.

6. The TDC converter as defined in claim 5 wherein the means for processing the first plurality of electrical signals to determine the time relevant characteristics thereof is further comprised of a second memory register electrically coupled to the output of the first memory register for receiving and summing a plurality of the at least one multiple bit digital words generated within the selectable time frame, and having an output which is at least a second multiple bit digital word.

7. The TDC converter as defined in claim 6 wherein the means for processing the first plurality of electrical signals to determine the time relevant characteristics thereof is further comprised of a memory electrically coupled to the second memory register at the output thereof for receiving and summing a plurality of the at least a second multiple bit digital words generated within the selectable time frame.

8. The TDC converter as defined in claim 5 wherein the means for processing the first plurality of electrical signals to determine the time relevant characteristics thereof is further comprised of a memory electrically coupled to the first memory register at the output thereof for receiving and summing a plurality of the at least one multiple bit digital words generated within the selectable time frame.

9. The TDC converter as defined in claim 8 wherein the TDC is further comprised of a control means for coordinating operation of the counting means, the first memory register, the second memory register, and a memory in accordance with a selectable method of operation.

10. The TDC converter as defined in claim 8 wherein a memory provides sequential recall of data stored therein by recalling a time stamp associated with each of the plurality of the at least one first multiple bit digital words generated within the selectable time frame.

11. The TDC converter as defined in claim 8 wherein a memory provides sequential recall of data stored therein by recalling the plurality of the at least one first multiple bit digital words generated within the selectable time frame in the order in which they were saved in the memory, thereby implicitly time stamping the data as it is stored therein.

12. The TDC converter as defined in claim 5 wherein the means for processing the first plurality of electrical signals to determine the time relevant characteristics thereof is further comprised of a compensation means which compensates for multiple hits of the signal on the microchannel plate which are not detected thereon by varying the at least one first multiple bit digital word by a compensation factor representative of a compensating number of hits.

13. The TDC converter as defined in claim 12 wherein the means for processing the first plurality of electrical signals to determine the time relevant characteristics thereof is further comprised of a look-up table electrically coupled thereto for storing values representative of the total number of the pulsed electrical signals generated within said selectable time frame, and wherein each of the stored values has associated therewith the compensation factor which is added to the at least one first multiple bit digital word.

14. The TDC converter as defined in claim 12 wherein the means for processing the first plurality of electrical signals to determine the time relevant characteristics thereof uses statistical or empirical data to calculate the compensation factor to be added to the at least one first multiple bit digital word.

15. The TDC converter as defined in claim 1 wherein the TDC further comprises a display means for graphically displaying characteristics of said stream of particles.

16. The TDC converter as defined in claim 15 wherein the time relevant characteristics of said stream of particles are displayed as a single-shot scaled waveform.

17. The TDC converter as defined in claim 1 wherein the plurality of anodes are physically arranged so as not to overlap.

18. The TDC converter as defined in claim 17 wherein the plurality of anodes are generally disposed in at least two columns, wherein edges of the plurality of anodes are abutting.

19. The TDC converter as defined in claim 18 wherein the at least two columns are generally offset at a face thereof so that at most three abutting edges of the plurality of detectors meet at any point on the edges thereof.

20. The TDC converter as defined in claim 1 wherein each of the plurality of anodes are sufficiently large on a face thereof, and the selectable threshold energy level of the plurality of threshold detector means is such that only one of the plurality of threshold detector means will generate the pulsed electrical signal from a single particle impact.

21. The TDC converter as defined in claim 1 wherein the plurality of detector means are selected from at least one of the group of detectors consisting of anodes, electrodes, and avalanche photo diodes.

22. The TDC converter as defined in claim 1 wherein the dynamic range of the TDC converter is generally increased by a factor equal to a total number of the plurality of detector means.

23. A method for increasing a dynamic range and time resolution of a time-to-digital (TDC) converter comprised of a plurality of detector means electrically coupled to the TDC, to thereby more accurately determine time relevant characteristics of a stream of particles, said method comprising the steps of:

1) detecting impact of the stream of particles on a surface of the plurality of detector means wherein the step of detecting impact of the stream of particles on a surface of the plurality of detector means comprises the more specific steps of:
   1) providing a microchannel plate disposed so as to receive the stream of particles on a surface thereof;
   2) generating the first plurality of electrical signals in response to the stream of particles;
   3) providing a plurality of anodes which are electrically coupled to the microchannel plate;
   4) transmitting the first plurality of electrical signals from the microchannel plate to the plurality of anodes; and
   5) processing the first plurality of electrical signals to generate a second plurality of processed electrical signals which represent time relevant characteristics of the stream of particles;
2) generating a first plurality of electrical signals from said plurality of detector means as a result of detection of the stream of particles;
3) receiving the first plurality of electrical signals from the plurality of detector means at the TDC; and
4) processing the first plurality of electrical signals in the TDC to determine time relevant characteristics of the stream of particles generally without distortion of the time relevant characteristics which occurs with large signals, and generally without obscuring by noise of the time relevant characteristics which occurs with small signals wherein the step of processing the first plurality of electrical signals to generate the second plurality of processed signals further comprises the steps of:
   1) providing a means for processing the at least one electrical signal and determining characteristics thereof comprised of a threshold detector means electrically coupled to the plurality of anodes; and
   2) transmitting the at least one second electrical signals from the threshold detector means which exceed a selectable threshold energy level.

24. The method as defined in claim 23 wherein the step of detecting impact of the stream of particles further comprises the step of detecting the impact of ions or photons on the plurality of detector means.

25. The method as defined in claim 23 wherein the step of providing a means for processing the first plurality of electrical signals to determine time relevant characteristics thereof further comprises the steps of:

1) providing a counting means which is electrically coupled to the threshold detector means;
2) receiving the second plurality of electrical signals which exceed the selectable threshold energy level; and
3) generating a digital electrical signal.

26. The method as defined in claim 25 wherein the step of providing a means for processing the first plurality of electrical signals to determine time relevant characteristics thereof further comprises the steps of:

1) providing a first memory register which is electrically coupled to the counting means;
2) receiving the digital electrical signal by the first memory register; and
3) generating at an output a plurality of the digital electrical signals which are generated within a selectable time frame.

27. The method as defined in claim 26 wherein the step of generating at the output a plurality of the pulsed electrical signals comprises the more specific steps of:

1) clearing the first memory register before any data is stored therein, and
2) summing in the first memory register the plurality of the digital electrical signals to thereby generate a first sum;
3) generating at the output a multiple bit digital word which is the first sum.

28. The method as defined in claim 27 wherein the step of generating at the output the first sum which is a multiple bit digital word further comprises the step of repeating steps 1) through 3) of claim 27 to thereby provide a plurality of multiple bit digital words at the output.

29. The method as defined in claim 28 wherein the step of providing the means for processing the first plurality of electrical signals to determine time relevant characteristics thereof further comprises the step of:

1) providing a third memory which is electrically coupled to the output of the first memory register;
2) receiving an output of a second memory register at the memory;
3) storing the output of the first memory register in a storage address of the memory; and
4) incrementing a memory pointer in the memory so that a next available memory storage address is available for storing data therein.

30. The method as defined in claim 29 wherein the step of providing a memory further comprises the step of providing a memory which can be used to recall data sequentially by providing a means for recalling the data in the order in which the data was stored.

31. The method as defined in claim 30 wherein the step of providing a memory for sequentially recalling data further comprises the step of providing a linear memory or a randomly accessible memory.

32. The method as defined in claim 30 wherein the step of repeating steps 1) through 3) of claim 28 to thereby provide a plurality of multiple bit digital words at the output further comprises the step of associating with each of the plurality of multiple bit digital words a time stamp which fixes in time when a particular multiple bit digital word is generated.

33. The method as defined in claim 32 wherein the step of providing a memory further comprises the step of providing a memory which can be used to recall data sequentially by recalling data stored therein according to the time stamp associated with each of the plurality of multiple bit digital words.

34. The method as defined in claim 27 further comprising the step of summing the plurality of the digital electrical signals to thereby generate a first sum further comprises the step of compensating for coincidence loss by increasing the first sum by a compensation factor representative of impacts of the first electrical signals which were not detected.

35. The method as defined in claim 34 wherein the step of compensating for coincidence loss by increasing the first sum by a compensation factor representative of impacts of the first electrical signals which were not detected further comprises the step of using a look-up table which has stored therein values representative of the first signal impacts which were detected, and wherein each of the values has associated therewith the corresponding compensation factor which is added to the first sum.

36. The method as defined in claim 26 wherein the step of providing a means for processing the first plurality of electrical signals to determine time relevant characteristics thereof further comprises the steps of:

1) providing a second memory register which is electrically coupled to the first memory register;
2) receiving the output of the first memory register at the second memory register as a plurality of multiple bit digital words; and
3) generating an output from the second memory register a second sum which is a sum of the plurality of multiple bit digital words from the first memory register which are generated over a plurality of selectable time frames.

37. The method as defined in claim 36 wherein the step of generating the output the second sum further comprises the step of repeating steps 2) and 3) of claim 36 to thereby generate an output a plurality of second sums.

38. The method as defined in claim 37 wherein the step of generating the plurality of second sums comprises the additional steps of:

1) providing a memory which is electrically coupled to the output of the second memory register;
2) receiving the output of the second memory register at the memory;
3) storing the output of the second memory register in a storage address of the memory; and
4) incrementing a memory pointer in the memory so that a next available memory storage address is available for storing data therein.

39. The method as defined in claim 38 wherein the step of storing the output of the second memory register in the memory further comprises the steps of:

1) determining if an out of memory condition has occurred in the memory, and if it has occurred, resetting said memory pointer to a beginning of the memory;
2) determining if a stop condition has occurred, and if it has occurred, proceeding to step 3) of claim 38, otherwise repeating steps 2) through 4) of claim 38; and
3) determining what type of at least three stop conditions has occurred, and executing an appropriate response.

40. The method as defined in claim 39 wherein the step of determining what type of the at least three stop conditions has occurred and executing an appropriate response further comprises executing one of the following three steps:

1) terminating data storage;
2) transmitting data from the memory to said second memory register or a display device; or
3) moving the memory means in the memory pointer to a new memory means and repeating steps 2) through 4) of claim 38.

* * * * *